United States Patent [19]

Kurimoto et al.

[11] Patent Number: 5,451,799
[45] Date of Patent: Sep. 19, 1995

[54] MOS TRANSISTOR FOR PROTECTION AGAINST ELECTROSTATIC DISCHARGE

[75] Inventors: Kazumi Kurimoto, Kobe; Isao Miyanaga, Kawachinagano; Atsushi Hori, Moriguchi, all of Japan

[73] Assignee: Matsushita Electric Industrial Co., Ltd., Osaka, Japan

[21] Appl. No.: 173,631

[22] Filed: Dec. 22, 1993

[30] Foreign Application Priority Data

Dec. 28, 1992 [JP] Japan .................................. 4-348096

[51] Int. Cl.⁶ ............................................ H01L 29/68
[52] U.S. Cl. ........................... 257/174; 257/240; 257/241; 257/345; 257/355; 257/546; 257/653; 257/773; 257/906
[58] Field of Search ............... 257/173, 174, 355, 546, 257/773, 906, 240, 241, 345, 653

[56] References Cited

U.S. PATENT DOCUMENTS 4,903,095  2/1990  Chapron .

FOREIGN PATENT DOCUMENTS 59-5671   1/1984  Japan .
59-10587  3/1984  Japan .
2-210838  8/1990  Japan .

Primary Examiner—Edward Wojciechowicz
Attorney, Agent, or Firm—Ratner & Prestia

[57] ABSTRACT

A MOS transistor for protection against electrostatic discharge includes a semiconductor substrate; an island including a source region and a drain region provided in the semiconductor substrate; an isolation region provided in the semiconductor substrate so as to surround the island; a gate insulating layer provided on the semiconductor substrate; a gate electrode provided on the gate insulating layer; and a distributing device for distributing an electric current generated by an electrostatic voltage applied to the drain region into the drain region.

9 Claims, 18 Drawing Sheets

MOS TRANSISTOR FOR PROTECTION AGAINST ELECTROSTATIC DISCHARGE

BACKGROUND OF THE INVENTION

1. Field of the Invention

The present invention relates to a semiconductor device, especially a MOS transistor for protecting an integrated circuit against electrostatic discharge.

2. Description of the Related Art

Recently, the size of the components of semiconductor integrated circuits has been remarkably reduced, and the minimum line width is now in the range of 1 μm and less which is called the "sub-micron range". In order to produce such microscopic components for integrated circuits, various steps have been taken including increase in the impurity concentration of the impurity regions, and reduction in the thickness of the gate oxide layer, in the thickness of the diffusion layer, and in the diameter of the contact area. Such steps have reduced the breakdown voltage of the gate oxide layer, which has caused the integrated circuit to be weak against electrostatic discharge.

Semiconductor integrated circuits generally include a protection circuit against electrostatic discharge, which is connected with an input pad or an output pad. Referring to FIGS. 22 to 26, a conventional MOS transistor used for protecting a semiconductor integrated circuit against electrostatic discharge will be described.

FIG. 22 is a circuit diagram of a conventional protection circuit 100 against electrostatic discharge. In the protection circuit 100, a transistor section 103 and a resistance 104 are connected in series between an input gate inverter 101 and an input pad 102. The transistor section 103 includes a transistor 105 connected to a power supply voltage and a transistor 106 which is grounded. FIG. 23 is a plan view in section of a conventional MOS transistor used as the transistor 106. FIG. 24 is a cross sectional view of the transistor 106 in FIG. 23 to show section line 24—24 in FIG. 23.

As is shown in FIGS. 23 and 24, the transistor 106 includes a semiconductor substrate 107 formed of p-type silicon. The semiconductor substrate 107 includes a p+-type diffusion region 108, a source region 109, a drain region 110, and a channel region 111 sandwiched between the source region 109 and the drain region 110. An island including the p+-type diffusion region 108, the source region 109, the drain region 110, and the channel region 111 is surrounded by an isolation region 112 which is also included in the semiconductor substrate 107.

The semiconductor substrate 107 is provided with an insulating film 113 on a surface thereof, and a gate electrode 114 is provided above the channel region 111 with a part of the insulating film 113 interposed therebetween. The insulating film 113 includes contact holes 115, 116 and 117. The contact holes 115 respectively define a plurality of contact regions 118 on the p+-type diffusion region 108, and the contact holes 116 respectively define a plurality of contact regions 119 on the source region 109. The contact holes 117 respectively define two contact regions 120a and a plurality of contact regions 120b on the drain region 110. In this specification, the "contact region" refers to a two-dimensional pattern in which a conductive element such as a wire is in contact with an impurity diffusion region such as the source region 109 and the drain region 110. In the insulating film 113, wires 121 and 122 are formed.

The wire 121 is electrically connected with the p+-type diffusion region 108 and the source region 109 through the contact holes 115 and 116, respectively. The wire 122 is electrically connected with the drain region 110 through the contact holes 117. The wire 122 is also electrically connected to the input pad 102 (FIG. 22), and the wire 121 and the gate electrode 114 are both grounded. The drain region 110 is connected to the input gate inverter 101 (FIG. 22) through the resistance 104.

The protection circuit 100 having the above-described structure operates in the following manner:

An electrostatic voltage is applied to the input pad 102 and is sent to the contact regions 120a and 120b on the drain region 110 through the wire 122 and the contact holes 117. Such an electrostatic charge raises the potential of the drain region 110 and further raises the potential of the semiconductor substrate 107. As a result, an electric current flows so as to operate the source region 109, the drain region 110 and the channel region 111 as a parasitic bipolar transistor 130. The source region 109 acts as an emitter, the drain region 110 acts as a collector, and the channel region 111 acts as a base of the bipolar transistor 130. Accordingly, the electrostatic charge applied to the drain region 110 flows out to the ground through the semiconductor substrate 107, the source region 109, and the wire 121. Thus, the potential of the drain region 110 falls to prevent the input gate inverter 101 from being supplied with a high voltage.

However, the conventional protection circuit 100 has the following problems:

When an electrostatic charge is applied to the input pad 102, the contact regions 120a and 120b on the drain region 110 are supplied with the electrostatic charge through the contact holes 117. The electric current generated by the electrostatic charge flows from the drain region 110 to the source region 109 through the channel region 111. At this point, as is shown in FIG. 25, the electric current is concentrated on the contact regions 120a which are close to the isolation region 112 and the gate electrode 114. Accordingly, the contact regions 120a are easily destroyed. FIG. 26 illustrates the relationship between distance D5 (FIG. 23) between the isolation region 112 and each contact region 120a and the maximum value of the current density in the contact region 120a. As is illustrated in FIG. 26, as distance D5 becomes longer, the maximum value of the current density is raised, and thus the possibility of destruction of the contact regions 120a is increased.

When distance D5 is made shorter in order to prevent the concentration of the current on the contact regions 120a based on the above-mentioned reason, a p-n junction interface 124 (FIG. 25) between a channel stop region 123 provided under the isolation region 112 and the drain region 110 becomes closer to the contact region 120a. Accordingly, the resistance of a part of the drain region 110 which is between the contact region 120a and the isolation region 112 is reduced, and thus the current is concentrated on the p-n junction interface 124 having a low breakdown voltage, thereby easily breaking the p-n junction interface 124.

SUMMARY OF THE INVENTION

A MOS transistor for protection against electrostatic discharge according to the present invention includes a semiconductor substrate; an island including a source region and a drain region provided in the semiconductor substrate; and isolation region provided in the semiconductor substrate so as to surround the island; a gate insulating layer provided on the semiconductor substrate; a gate electrode provided on the gate insulating layer; and a device for distributing an electric current generated by an electrostatic voltage applied to the drain region into the drain region or for preventing an electric current generated by an electrostatic voltage applied from flowing to an area of the drain region proximate to the isolation region.

Thus, the invention described herein makes possible the advantage of providing a MOS transistor for protection against electrostatic discharge for avoiding concentration of an electric current on one particular part thereof, preventing destruction of the contact layer by melting of the semiconductor substrate, raising breakdown voltage, and preventing destruction of the gate oxide layer.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
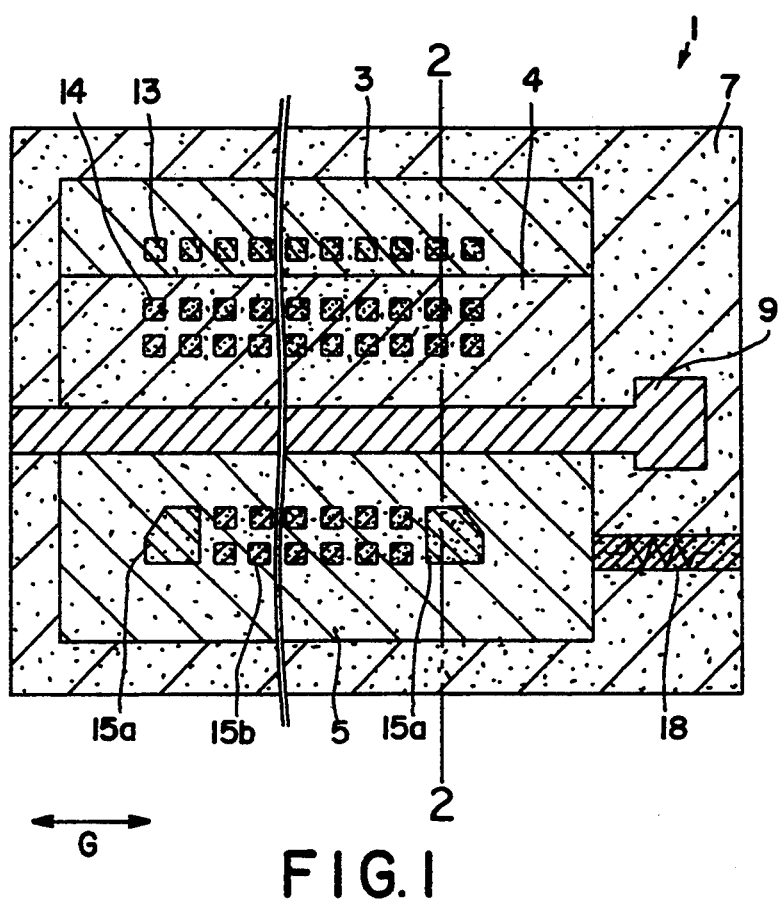
FIG. 1 is a plan view in section of a transistor for protection against electrostatic discharge in a first example according to the present invention.
Figure 2:
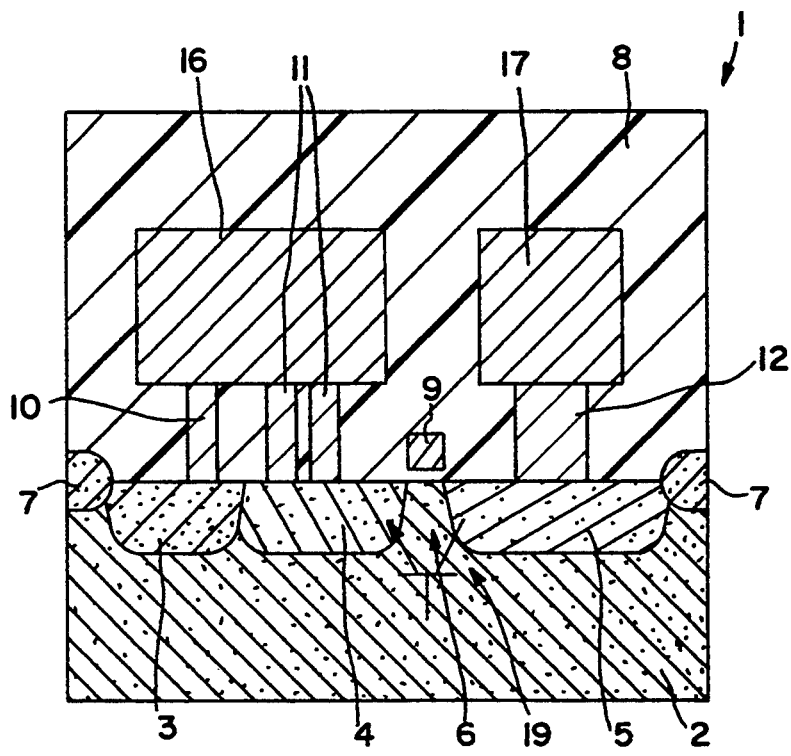
FIG. 2 is a cross sectional view of the transistor shown in FIG. 1 to show section line 2—2 in FIG. 1.

FIG. 1 is a plan view in section of a MOS transistor 1 for protection against electrostatic discharge in a first example according to the present invention; and FIG. 2 is a cross sectional view of the transistor 1 shown in FIG. 1 to show section line 2—2 in FIG. 1.

As is shown in FIGS. 1 and 2, the transistor 1 includes a semiconductor substrate 2 formed of p-type silicon having a sheet resistance of approximately 500 ohms per square. The semiconductor substrate 2 includes a p$^+$-type diffusion region 3, a source region 4, a drain region 5, and a channel region 6 sandwiched between the source region 4 and the drain region 5. The source region 4 and the drain region 5 each have a depth of approximately 0.15 μm and a sheet resistance of approximately 100 ohms per square. The p$^+$-type diffusion region 3 is provided to apply a bias voltage to the semiconductor substrate 2. An island including the p$^+$-type diffusion region 3, the source region 4, the drain region 5, and the channel region 6 is surrounded by an isolation region 7 also included in the semiconductor substrate 2.

The semiconductor substrate 2 is provided with an insulating layer 8 formed of silicon oxide on a surface thereof. A gate electrode 9 is provided above the channel region 6 with a part of the insulating film 8 interposed therebetween. The part of the insulating film 8 which is located between the gate electrode 9 and the channel region 6 has a thickness of approximately 10 nm, and acts as a gate insulating layer. The gate electrode 9 is extended along direction G and has a gate length of approximately 1 μm. The insulating layer 8 includes contact holes 10, 11 and 12. The contact holes 10 respectively define a plurality of contact regions 13 on the p+-type diffusion region 3; and contact holes 11 respectively define a plurality of contact regions 14 on the source region 4. The contact holes 12 respectively define two contact regions 15a and a plurality of contact regions 15b on the drain region 5. Two contact regions 15a and 15b are provided in order to distribute the current generated by the electrostatic voltage applied to the drain region 5 into various parts of the drain region 5.

In the insulating layer 8, wires 16 and 17 made of aluminum are formed. The wire 16 is electrically connected to the p+-type diffusion region 3 and the source region 4 through the contact holes 10 and 11, respectively. The wire 17 is electrically connected to the drain region 5 through the contact holes 12. The drain region 5 is connected to an input gate inverter (not shown) through a resistance 18 provided in the semiconductor substrate 2 for protection against electrostatic discharge. The wire 16 and the gate electrode 9 are both grounded. The wire 17 is connected to an input pad (not shown).

Figure 3:
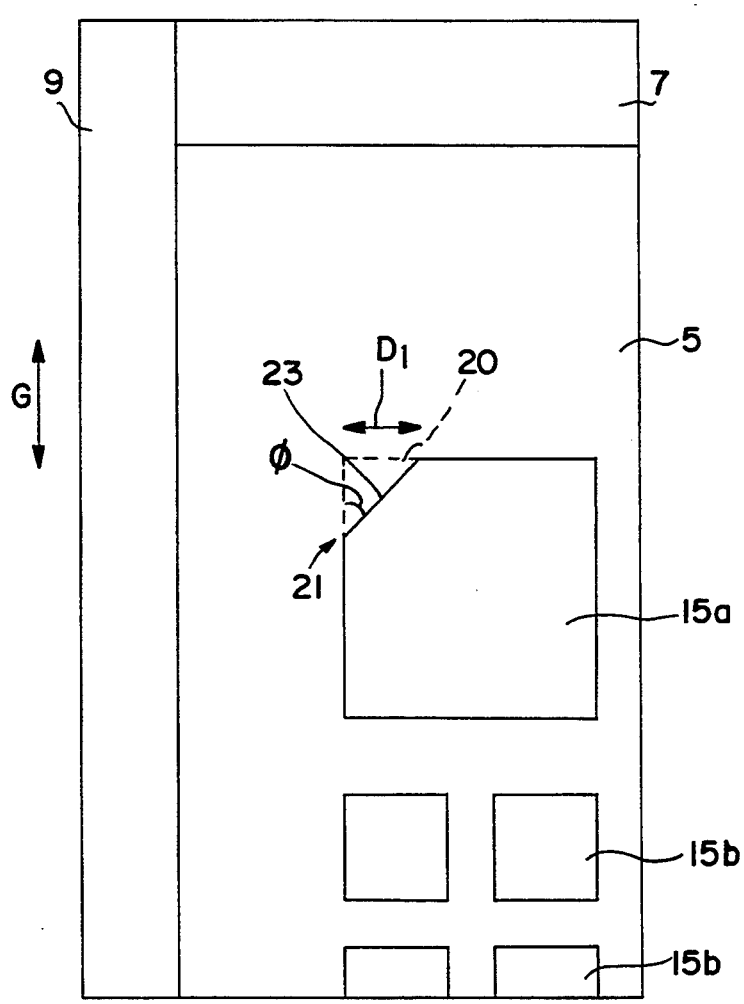
FIG. 3 is an enlarged view of a contact region of the transistor shown in FIG. 1.

Referring to FIGS. 1 and 3, how the electrostatic voltage applied to the drain region 5 is distributed to various parts of the drain region 5 will be described in detail.

FIG. 3 is an enlarged view of the contact region 15a of the transistor 1 and the vicinity thereof. In FIG. 3, only one of the two identical contact regions 15a is shown for simplicity. The plurality of contact regions 15b as well as the contact regions 15a are disposed on the drain region 5. The contact regions 15b are arranged in a matrix in the central area of the drain region 5. The contact regions 15a each have an area larger than an area of each contact region 15b, and are arranged on two ends of the drain region 5 to interpose the contact regions 15b. The contact regions 15a each have a triangular notch 20 at a corner thereof, the side of the triangular notch 20 respectively opposing the gate electrode 9 and the isolation region 7. The contact regions 15b each have an area which is determined by a minimum size set by the design rule. Practically, the contact regions 15b are each a square having an area of 0.8 $\mu$m × 0.8 $\mu$m. Two adjacent contact regions 15b are 0.5 $\mu$m away from each other. The contact region 15a and the contact region 15b adjacent to the contact region 15a are also 0.5 $\mu$m away from each other. The contact regions 15a are each a square having an area of 2.1 $\mu$m × 2.1 $\mu$m having the notch 20. The notch 20 is a right-angled triangle in which two sides thereof are 1.6 $\mu$m long and 0.9 $\mu$m long. The contact regions 15a and 15b are provided 2 $\mu$m away from the gate electrode 9, and the contact regions 15a are provided 3 $\mu$m away from the isolation region 7.

The transistor 1 having the above-described structure operates in the following manner:

An electrostatic voltage is applied to the input pad (not shown) and is sent to the contact regions 15a and 15b on the drain region 5 through the wire 17 and the contact holes 12. Such an electrostatic voltage raises the potential of the drain region 5 and further raises the potential of the semiconductor substrate 2. As a result, a current is generated and flows so as to operate the source region 4, the drain region 5, and the channel region 6 as a parasitic bipolar transistor 19. The source region 4 acts as an emitter, the drain region 5 acts as a collector, and the channel region 6 acts as a base of the bipolar transistor 19. The current flowing through the drain region 5 is concentrated on the contact regions 15a. Since the contact regions 15a have a larger area than that of the contact regions 15b and further have the notch 20, the current is distributed to various parts of the contact regions 15a, especially to a side 23 of the notch 20. Thus, concentration of the current on one particular part of the drain region 5 is avoided. Accordingly, the contact regions 15a are prevented from being destroyed by melting of the semiconductor substrate 2. Further, the breakdown voltage of the transistor 1 is raised, and the gate oxide layer of the semiconductor integrated circuit to be protected is prevented from being destroyed by electrostatic discharge.

Figure 4A:
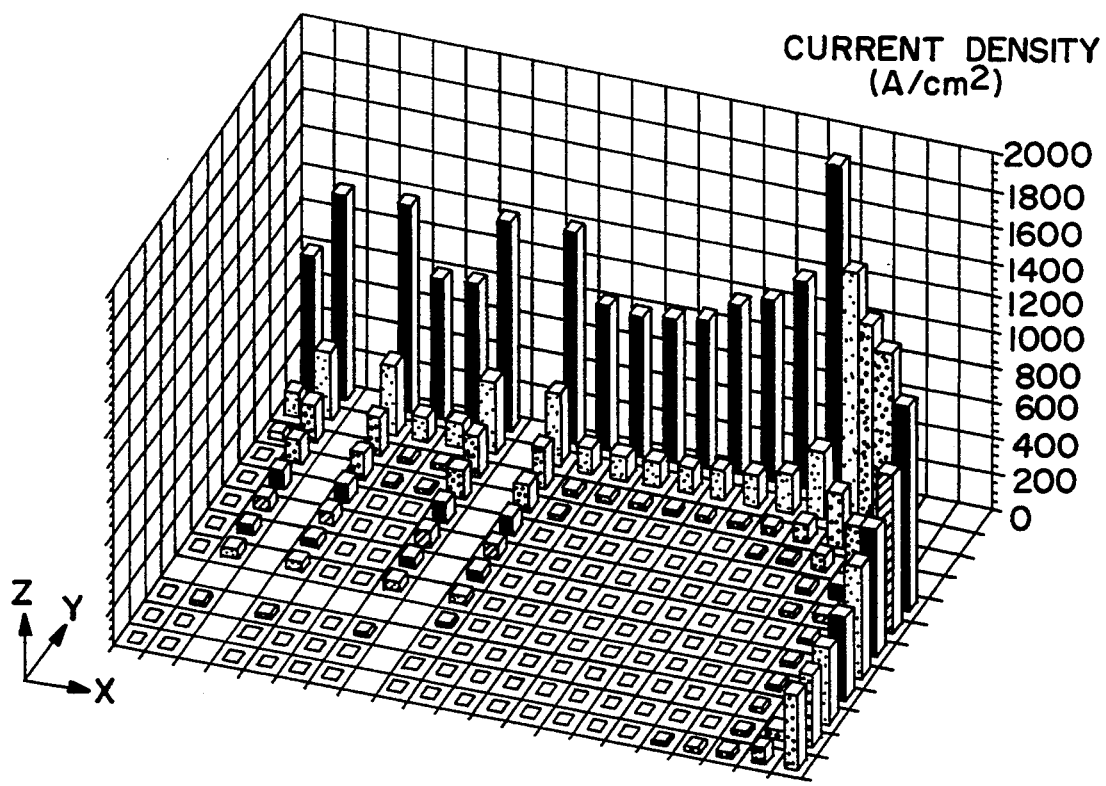
FIGS 4a and 4b are views illustrating distribution of the current density in the contact region shown in FIG. 3.
Figure 4B:
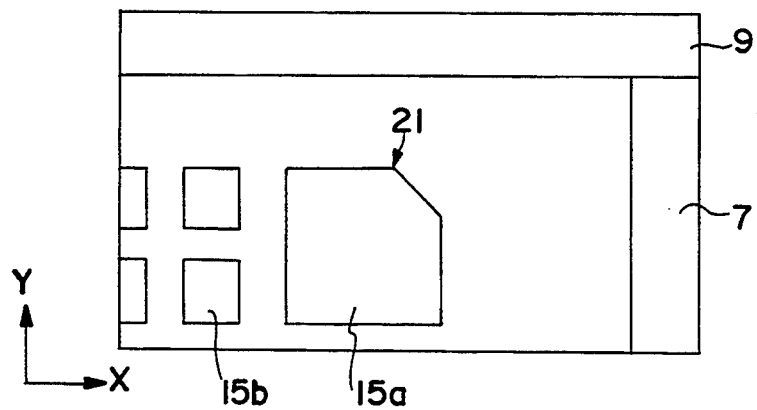

FIG. 4a is a view illustrating a distribution state of the current density in the contact region 15a and the vicinity thereof. The position of each of the contact regions 15a and 15b is represented by the X axis as shown in FIG. 4b and the Y axis. The Z axis represents the current density. As is shown in FIG. 4, the current density is at the maximum level thereof at point 21 of the contact region 15a. The maximum value is 1854 A/cm$^2$, which is about 45% lower than the value obtained in the conventional transistor. As is apparent from this numerical figure, the possibility of destruction of the contact regions 15a is reduced, and thus the breakdown voltage of the transistor 1 is raised.

Figure 5:
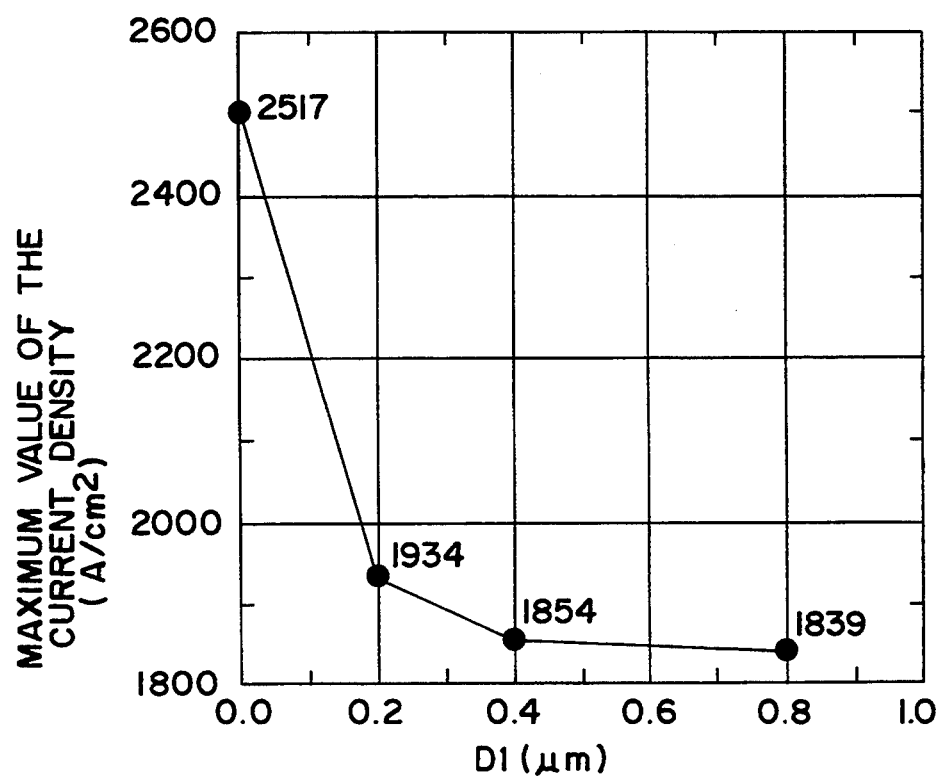
FIG. 5 is a graph illustrating the relationship between the size of a notch and the maximum value of the current density.

In order to distribute the current in the drain region 5 efficiently, the side 23 (FIG. 3) of the notch 20 is desirably inclined at an angle $\phi$ of 45° or less with respect to direction G. The side 23 is also desirably as long as possible. FIG. 5 illustrates the relationship between the size of the notch 20 and the maximum value of the current density. The size of the notch 20 is represented by length D1 of the side opposed to the isolation region 7. Here, the side 23 makes an angle of 45° with respect to the side opposed to the gate electrode 9. The notch 20 is an isosceles triangle having one right angle in which the side opposed to the gate electrode 9 and the side opposed to the isolation region 7 have the same length as each other. As is shown in FIG. 5, as length D1 becomes longer, the maximum value of the current density becomes lower.

The transistor 1 according to the present invention can be produced by conventional production technologies, namely, only by altering the pattern of a mask so as to define the contact regions 13, 14, 15a and 15b in the production process of the semiconductor apparatus in which the transistor 1 is included. Since no new process is necessary, the production is simple and the costs are the same as the conventional transistors.

In the transistor 1 in the above-described example, the contact regions 15a having a large area and further having a notch 20 is provided for distributing the current generated by an electrostatic discharge applied to the drain region 5 to various parts of the drain region 5. Alternatively, contact regions having a large area with no notch or contact regions having a notch but having the same area as that of the other contact regions may also be used instead of the contact regions 15a.

Figure 6A:
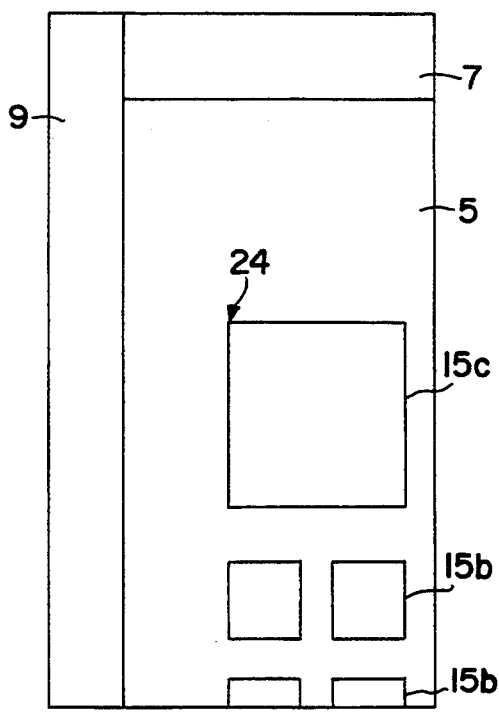
FIGS. 6A to 6D are enlarged views of a contact region in modifications of the first example according to the present invention.

Practically, as is shown in FIG. 6A, the drain region 5 may have a plurality of contact regions 15b and two contact regions 15c each having a larger area than an area of each contact region 15b. (Only one of the contact regions 15c is shown in FIG. 6A for simplicity.) For example, the contact regions 15b each have an area determined by a minimum size set by the design rule. For example, the contact regions 15b are each a square having an area of 0.8 $\mu$m × 0.8 $\mu$m. The contact regions 15c are adjacent to the isolation region 7, and are each a square having an area of 2.1 μm ×2.1 μm. Since the contact region 15c adjacent to the isolation region 7 is larger than the contact regions 15b, the current flowing through the channel region 6 is distributed to the various parts of the contact regions 15c. The maximum value of the current density at point 24 is 2517 A/cm$^2$, which is approximately 25% lower than the value obtained in the conventional transistor.

Figure 6B:
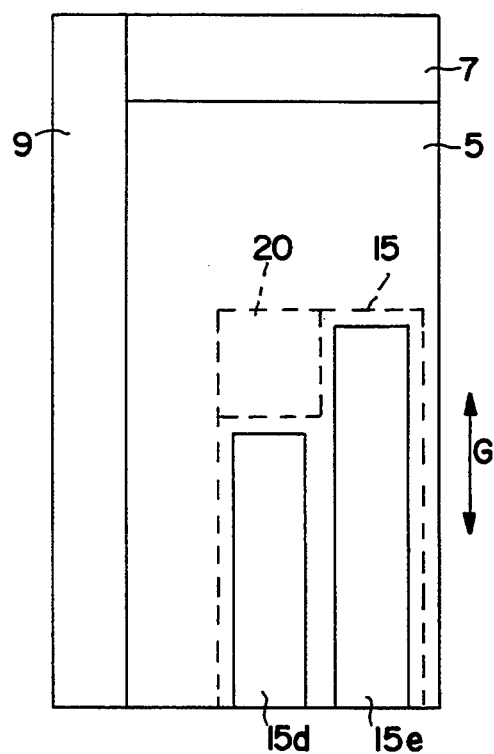

Alternatively, as is shown in FIG. 6B, a sub-contact region 15d and a sub-contact region 15e which is longer than the sub-contact region 15d in direction G may be provided on the drain region 5. The sub-contact regions in such an arrangement can be considered as a contact region 15 having a notch 20.

Figure 6C:
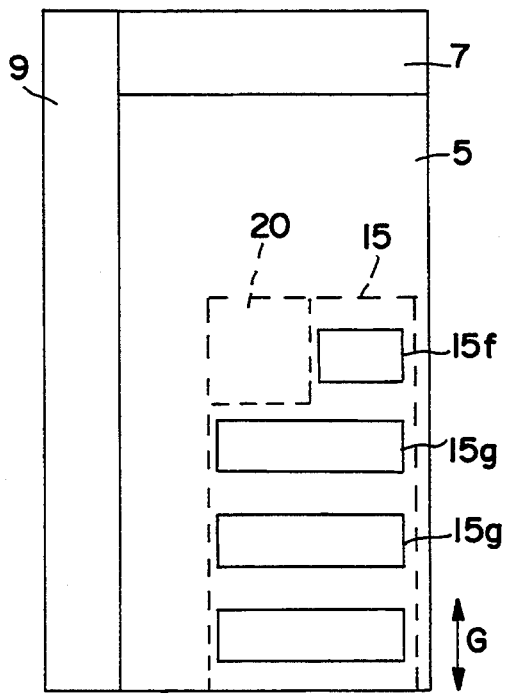

As is shown in FIG. 6C, sub-contact regions 15f and 15g extended in a direction which is perpendicular to direction G may be provided on the drain region 5. The sub-contact region 15f is shorter than each sub-contact region 15g. The sub-contact regions in such an arrangement can be considered as a contact region 15 having a notch 20.

Figure 6D:
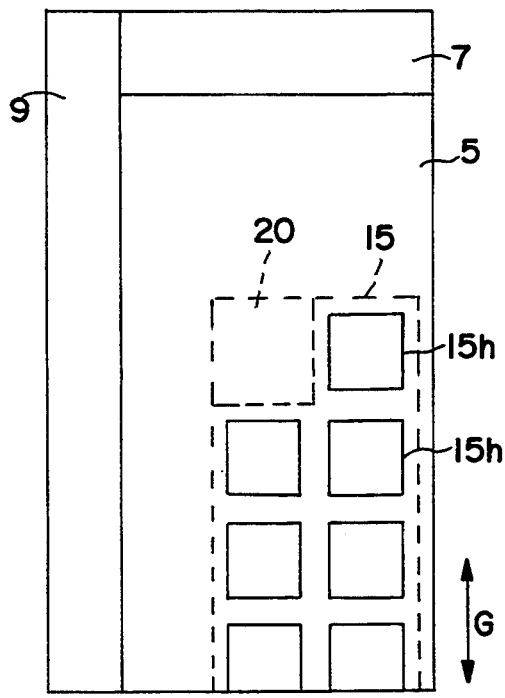

As is shown in FIG. 6D, sub-contact regions 15h having a minimum size set by the design rule may be provided on the drain region 5. The sub-contact regions 15h are generally arranged in a matrix except for one corner. The sub-contact regions in such an arrangement can be considered as a contact region 15 having a notch 20.

EXAMPLE 2

Figure 7:
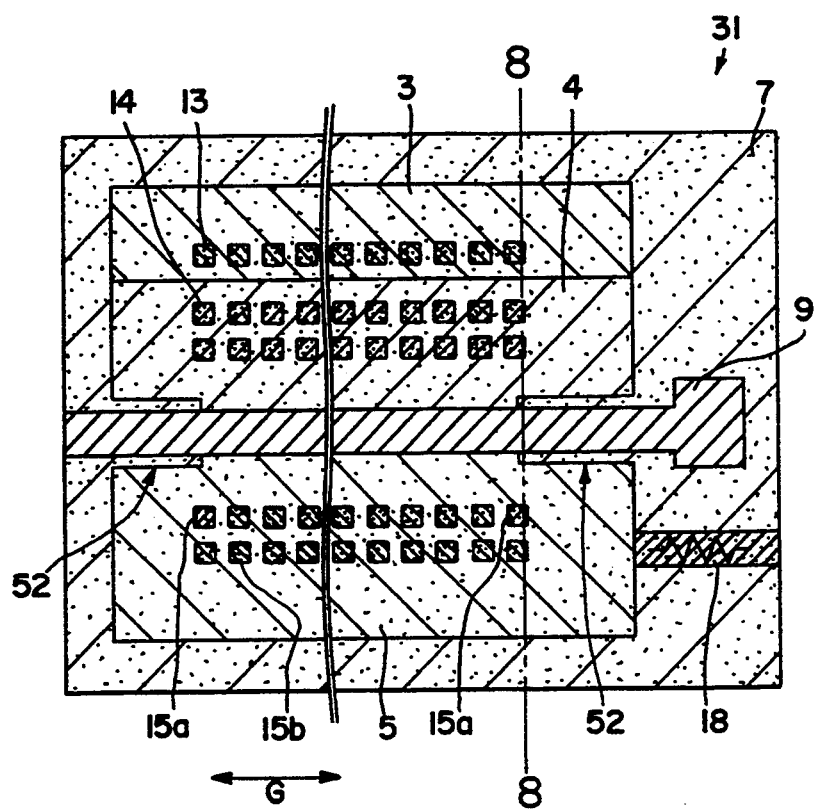
FIG. 7 is a plan view in section of a transistor for protection against electrostatic discharge in a second example according to the present invention.
Figure 8:
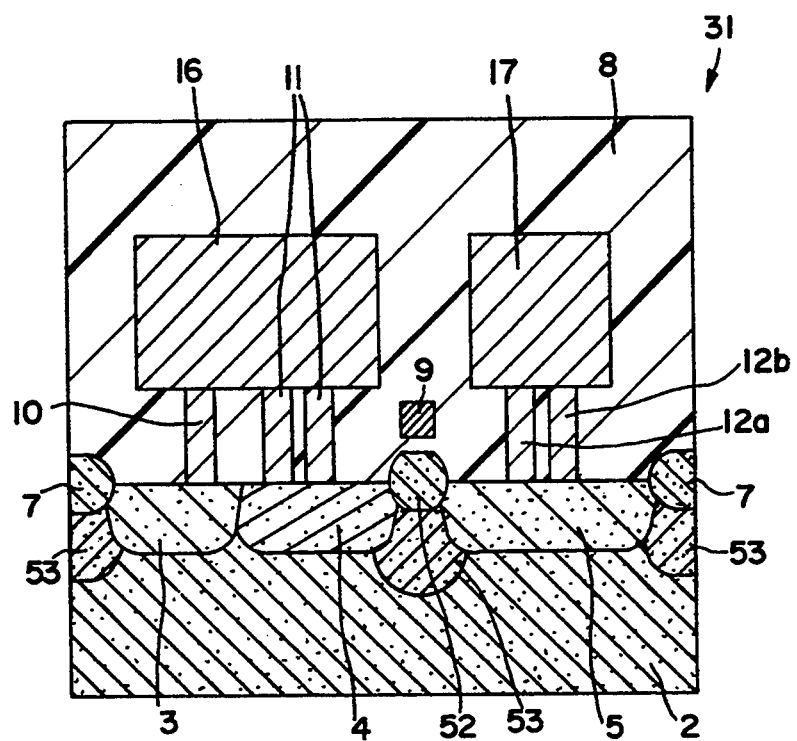
FIG. 8 is a cross sectional view of the transistor shown in FIG. 7 to show section line 8—8 in FIG. 7.

FIG. 7 is a plan view in section of a MOS transistor 31 for protection against electrostatic discharge in a second example according to the present invention; and FIG. 8 is a cross sectional view of the transistor 31 shown in FIG. 7 to show section line 8—8 in FIG. 7. Identical elements with those in the first example bear identical reference numerals therewith.

As is shown in FIGS. 7 and 8, the transistor 31 includes a semiconductor substrate 2 formed of p-type silicon having a sheet resistance of approximately 500 ohms per square. The semiconductor substrate 2 includes a p$^+$-type diffusion region 3, a source region 4, a drain region 5, and a channel region 6 sandwiched between the source region 4 the drain region 5. The source region 4 and the drain region 5 each have a depth of approximately 0.15 μm and a sheet resistance of approximately 100 ohms per square. The p$^+$-type diffusion region 3 is provided in order to apply a bias voltage to the semiconductor substrate 2. An island including the p$^+$-type diffusion region 3, the source region 4, the drain region 5, and the channel region 6 is surrounded by an isolation region 7 also included in the semiconductor substrate 2.

The isolation region 7 includes two projecting areas 52 extended between the source region 4 and the drain region 5 toward the central area of the island. A channel stop region 53 is provided below the isolation region 7 including the projecting areas 52 in the semiconductor substrate 2.

The semiconductor substrate 2 is provided with an insulating layer 8 formed of silicon oxide on a surface thereof. A gate electrode 9 is provided above the channel region 6 and the projecting areas 52 with a part of the insulating film 8 interposed therebetween. The part of the insulating film 8 which is located between the gate electrode 9 and the channel region 6 has a thickness of approximately 10 nm, and acts as a gate insulating layer. The gate electrode 9 is extended along direction G and has a gate length of approximately 1 μm. The insulating layer 8 includes contact holes 10, 11, 12a and 12b. The contact holes 10 respectively define a plurality of contact regions 13 on the p$^+$-type diffusion region 3; and contact holes 11 respectively define a plurality of contact regions 14 on the source region 4. The contact holes 12a respectively define two contact regions 15a on the drain region 5. The contact holes 12b respectively define a plurality of contact regions 15b on the drain region 5.

In the insulating layer 8, wires 16 and 17 made of aluminum are formed. The wire 16 is electrically connected to the p$^+$-type diffusion region 3 and the source region 4 through the contact holes 10 and 11, respectively. The wire 17 is electrically connected to the drain region 5 through the contact holes 12a and 12b. The drain region 5 is connected to an input gate inverter (not shown) through a resistance 18 provided in the semiconductor substrate 2 for protection against electrostatic discharge. The wire 16 and the gate electrode 9 are both grounded. The wire 17 is connected to an input pad (not shown).

Figure 9:
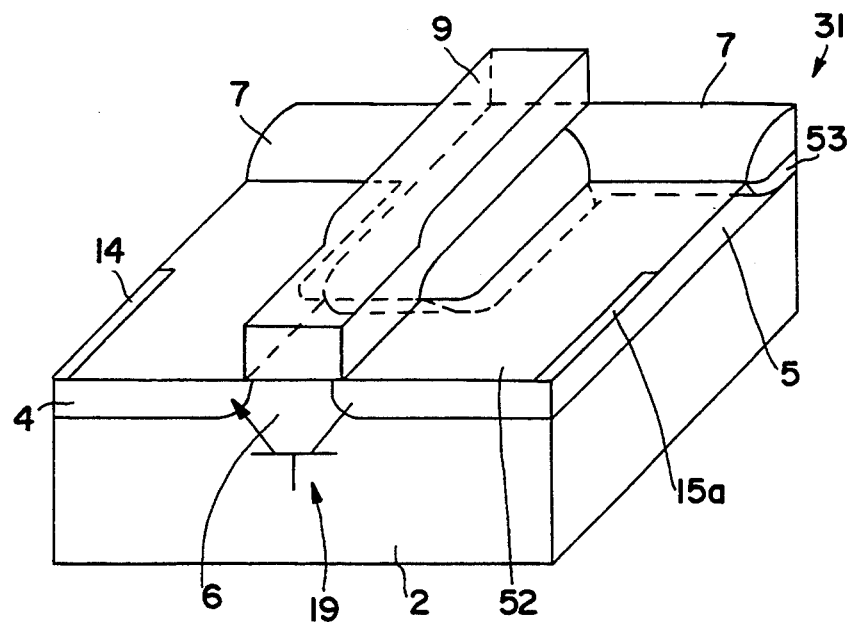
FIG. 9 is an enlarged isometric view of a part of the transistor shown in FIG. 7.
Figure 10:
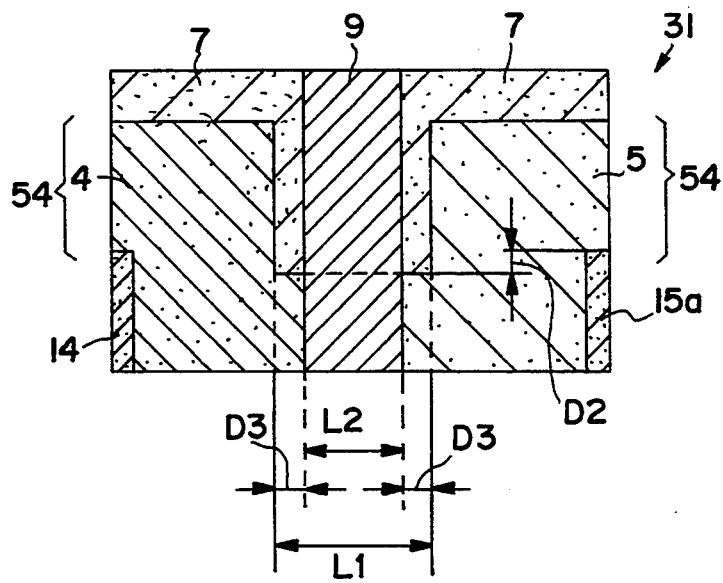
FIG. 10 is an enlarged plan view of the part of the transistor shown in FIG. 7.

Referring to FIGS. 9 and 10, how the electrostatic voltage applied to the drain region 5 is distributed to various parts of the drain region 5 will be described in detail.

FIG. 9 is an enlarged isometric view of the projecting area 52 of the isolation region 7 of the transistor 31 and the vicinity thereof. In FIG. 9, only one of the two identical projecting areas 52 is shown for simplicity. FIG. 10 is a plan view of the part shown in FIG. 7.

As is shown in FIGS. 9 and 10, the projecting area 52 and the channel region 6 are interposed between the source region 4 and the drain region 5. The projecting area 52 is extended in direction G, and has such a length as to overlap the contact region 15a by distance D2. Distance D2 is, for example, approximately 0.1 μm. Width L1 of the projecting area 52 is larger than gate length L2 of the gate electrode 9 by 2×D3.

The transistor 31 having the above-described structure operates in the following manner:

An electrostatic voltage is applied to the input pad and is sent to the contact regions 15a and 15b on the drain region 5 through the wire 17 and the contact holes 12a and 12b. Such an electrostatic voltage raises the potential of the drain region 5 and further raises the potential of the semiconductor substrate 2. As a result, a current is generated and flows so as to operate the source region 4, the drain region 5, and the channel region 6 as a parasitic bipolar transistor 19. The source region 4 acts as an emitter, the drain region 5 acts as a collector, and the channel region 6 acts as a base of the bipolar transistor 19. The electrostatic voltage applied to the drain region 5 flows out to the ground through the source region 4. Since the current hardly flows through an area 54 of the source region 4 and the drain region 5 which are close to the isolation region 7, substantially no amount of current reaches the contact region 15a. Thus, concentration of the current on the contact regions 15a is alleviated. Accordingly, the contact regions 15a are prevented from being destroyed by melting of the semiconductor substrate 2. As is mentioned above, due to the projecting areas 52 of the isolation region 7, the current generated by the electrostatic voltage can be prevented from flowing to the area 54 of the drain region 5 close to the isolation region 7.

Further, as is described above and shown in FIG. 8, the transistor 31 includes the channel stop region 53 below the isolation region 7 including the projecting area 52. Due to the channel stop region 53 which reduces the amount of the current flowing through an area of the semiconductor substrate 2 below the projecting area 52, the current flowing through the area 54 is further reduced.

The transistor 31 according to the present invention can be produced by conventional production technologies, namely, only by altering the pattern of a mask so as to define the isolation region 7 having the projecting areas 52 in the production process of the semiconductor apparatus in which the transistor 31 is included. Since no new process is necessary, the production is simple and costs the same as conventional transistors.

The transistor in the second example may be modified as follows.

MODIFICATION 1

Figure 11:
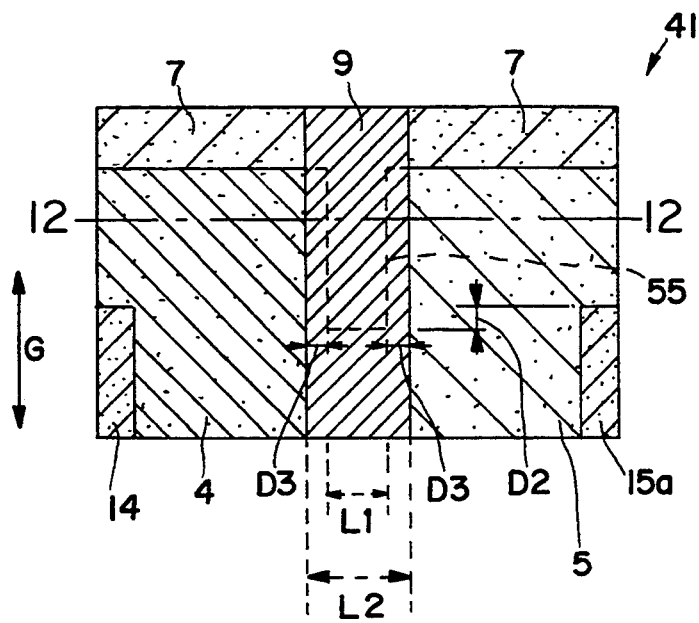
FIG. 11 is an enlarged plan view in section of a transistor in a modification of the transistor shown in FIG. 7 in the second example according to the present invention.
Figure 12:
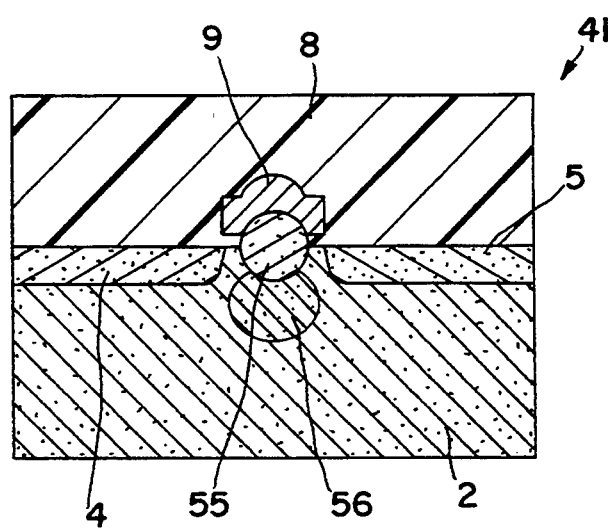
FIG. 12 is a cross sectional view of the transistor shown in FIG. 11 to show section line 12—12.

As is shown in FIGS. 11 and 12, a MOS transistor 41 is provided with two projecting areas 55 of the isolation region 7 instead of the projecting areas 52. FIG. 11 is an enlarged plan view of the part including one of the projecting areas 55 of the transistor 41; and FIG. 12 is a cross sectional view of the part shown in FIG. 11 to show section line 12—12 of FIG. 11.

The projecting area 55 and the channel region 6 (not shown) are interposed between the source region 4 and the drain region 5. The gate electrode 9 is provided on the projecting area 55 and the channel region 6. The projecting area 55 is extended in direction G, and has such a length as to overlap the contact region 15a by distance D2. Distance D2 is, for example, approximately 0.1 $\mu$m. Width L1 of the projecting area 55 is smaller than gate length L2 of the gate electrode 9 by 2×D3.

A channel stop region 56 is provided below the isolation region 7 including the projecting areas 55. The channel stop region 56, which is formed using a mask for forming the isolation region 7 having the projecting areas 55, has substantially the same width as width L1 of the projecting areas 55. The source region 4 and the drain region 5, which are formed using the gate electrode 9 as a mask, are away from each other by a distance substantially the same as gate length L2 of the gate electrode 9. Accordingly, the channel stop region 56 is not in contact with the source region 4 or the drain region 5.

In the transistor 41 having the above-described structure, formation of a p-n junction by the source region 4 and the channel stop region 56 or the drain region 5 and the channel stop region 56 is avoided. Accordingly, the transistor 41 has excellent functions as a protection element for the integrated circuit. Further, the transistor 41 is especially suitable when produced in a microscopic size for the following reason:

When the transistor 41 is produced in a microscopic size, the source region 4 and the drain region 5 have a small depth, resulting in having a high resistance. In order to protect an input inverter under these situations, the gate electrode 9 and each contact region 15a are desirably formed at a short distance from each other in order to reduce the parasitic resistance and thus to make the electrostatic voltage escape from the transistor 41 in a short time. However, in the transistor 31 shown in FIGS. 7 to 10, when the gate electrode 9 and the contact region 15a are formed very close to each other, a high voltage is applied to a p-n junction of the channel stop region 53 and the drain region 5, thus possibly destroying the p-n junction.

By contrast, the transistor 41 having the projecting areas 55, the channel stop region 56 is out of contact from the drain region 5. Accordingly, even if a high voltage is applied between the drain region 5 and the channel stop region 56 by application of an electrostatic voltage, the electrostatic voltage escapes from the transistor 41 with no destruction of the junction. For this reason, the transistor 41 is suitable as a microscopic transistor.

Figure 13:
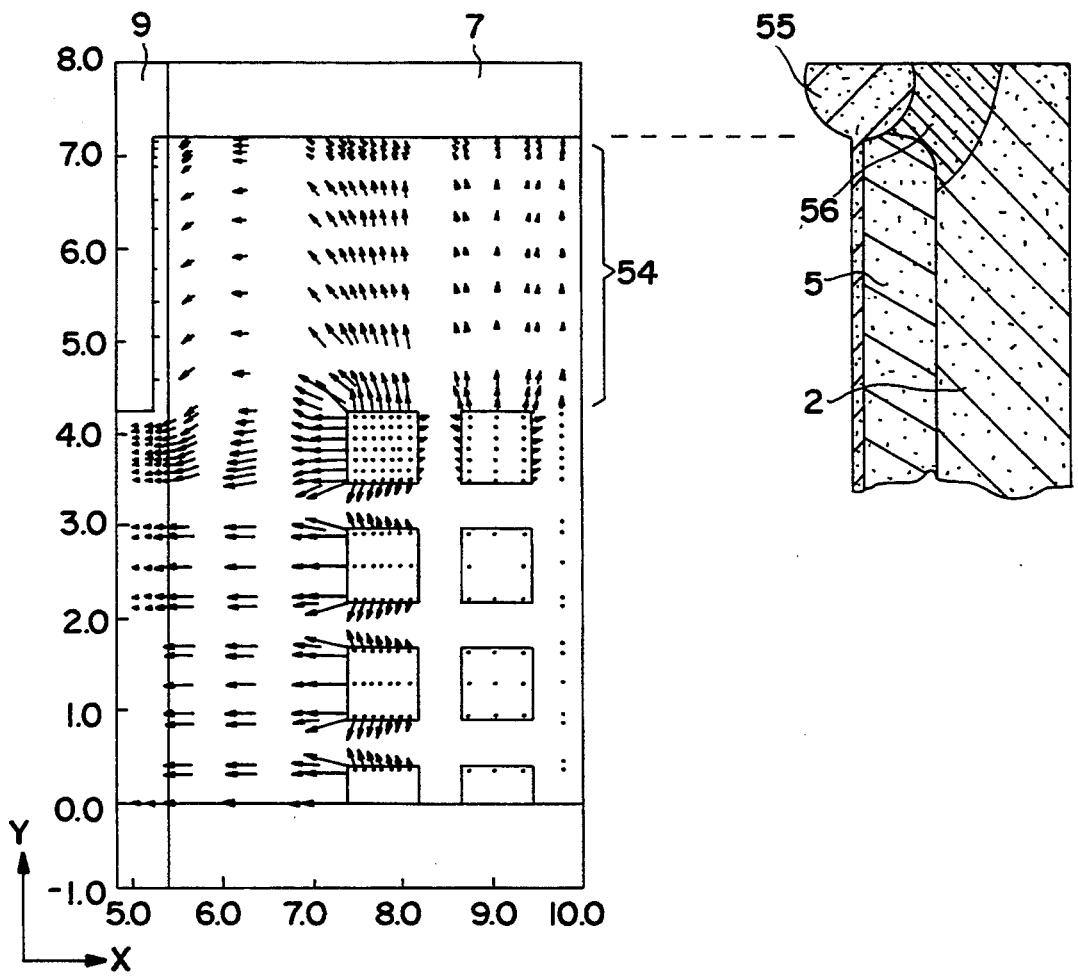
FIG. 13 is a view illustrating flow directions of the current in the transistor shown in FIG. 11.
Figure 13:
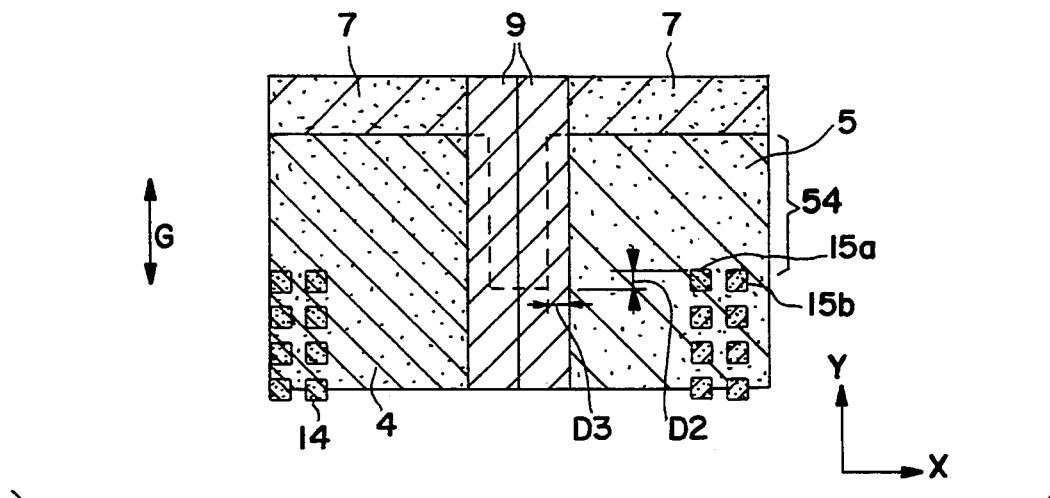
Figure 14:
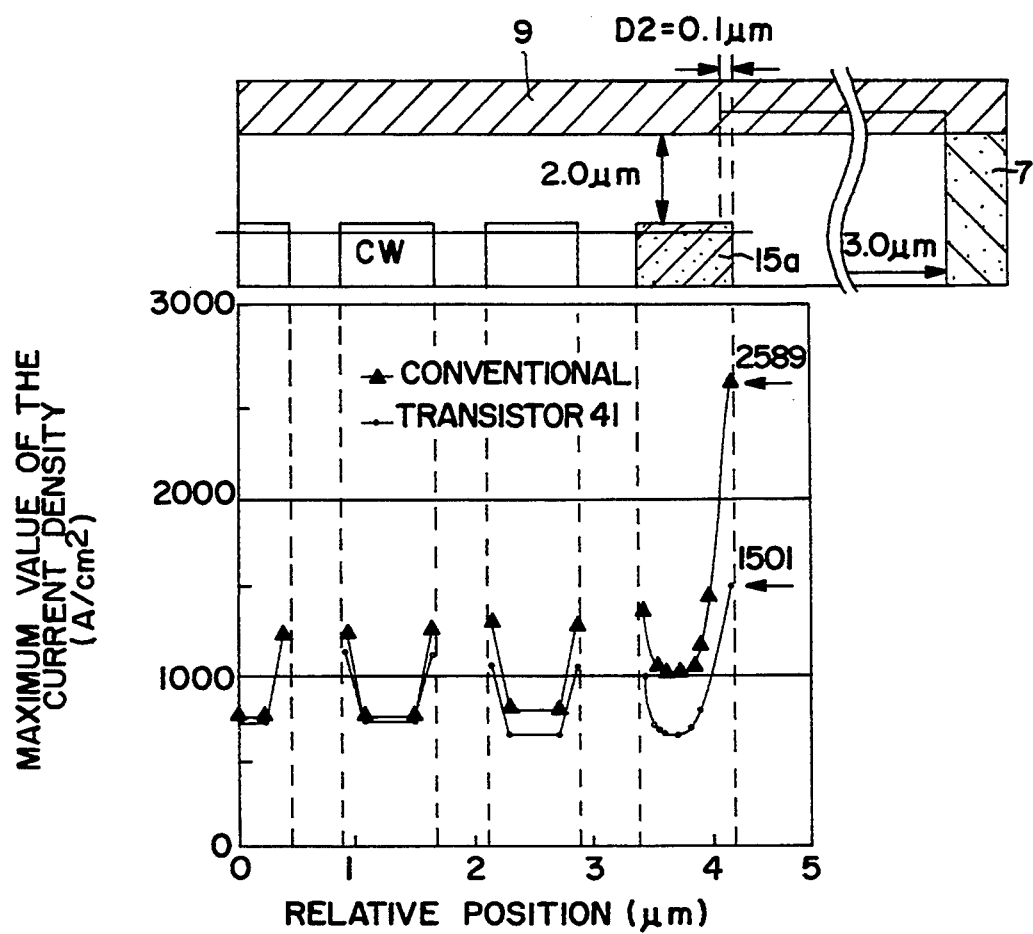
FIG. 14 is a view illustrating a distribution state of the current density in the drain region of the transistor shown in FIG. 11.

FIG. 13 illustrates flow directions of the current when the transistor 41 is in operation; and FIG. 14 illustrates a distribution state of the current density in the drain region 5 of the transistor 41. In FIG. 13, arrows represent vectors of the current density in the drain region 5. As is shown in FIGS. 13 and 14, the amount of the current flowing in the area 54 in the drain region 5 is small, and thus the current density is lower in this area in the transistor 41 than in the conventional transistor. As is apparent from FIG. 14, the maximum value of the current density is approximately 40% lower in the transistor 41 than in the conventional transistor.

Assuming that the resistance of the contact region 15a is maintained at a constant level, the power consumed by the contact region 15a is in proportion to the square of the current density. Accordingly, the breakdown voltage against electrostatic voltage in the contact region 15a is increased by 40% compared with the conventional transistor.

MODIFICATION 2

Figure 15:
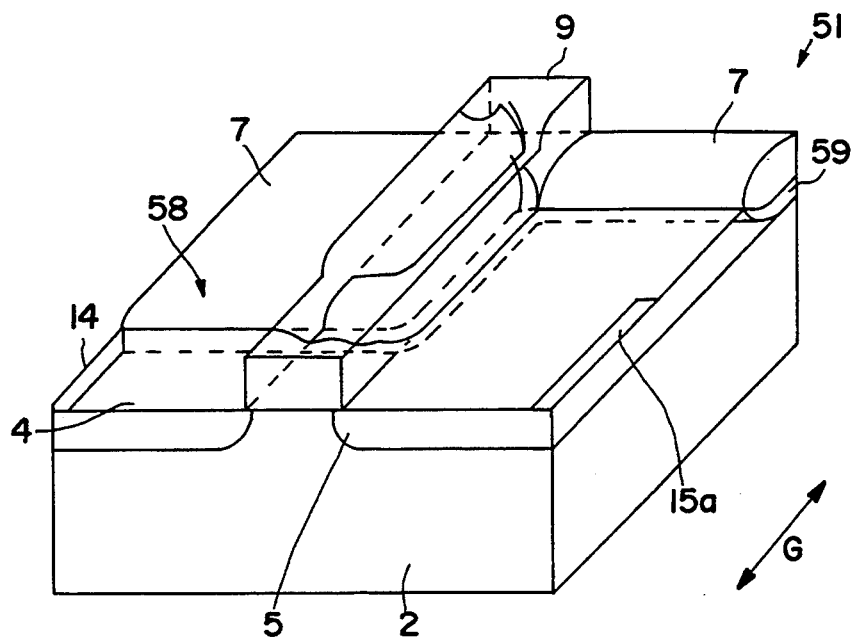
FIG. 15 is an enlarged isometric view of a part of a transistor in another modification of the transistor shown in FIG. 7 in the second example according to the present invention.
Figure 16:
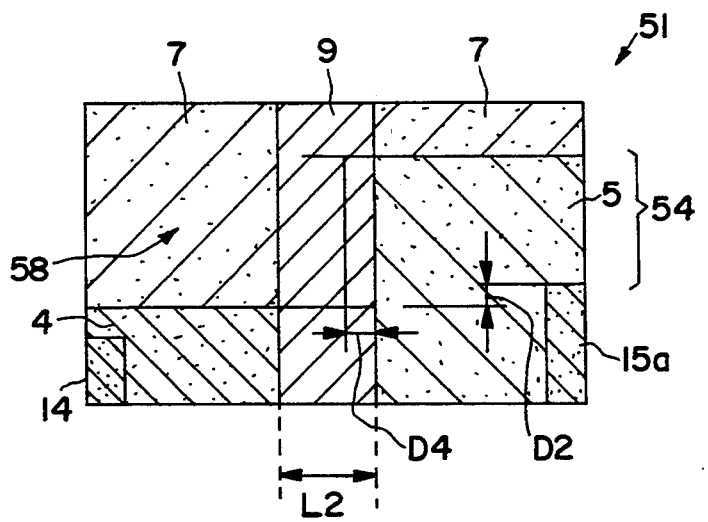
FIG. 16 is an enlarged plan view of the part of the transistor shown in FIG. 15.

As is shown in FIGS. 15 and 16, a MOS transistor 51 is provided with two projecting areas 58 of the isolation region 7 instead of the projecting areas 52. FIG. 15 is an enlarged isometric view of the part including one of the projecting areas 58 of the transistor 51; and FIG. 16 is a plan view of the part shown in FIG. 15.

The projecting area 58 is extended in direction G on the source region 4, and has such a length as to overlap the contact region 15a by distance D2. Distance D2 is, for example, approximately 0.1 $\mu$m. The projecting area 58 is also extended in a direction perpendicular to direction G below the gate electrode 9. The projecting area 58 and the drain region 5 are away from each other by distance D4.

A channel stop region 59 is provided below the isolation region 7 including two projecting areas 58. The channel stop region 59, which is formed using a mask for forming the isolation region 7 having the projecting areas 58, is away from the drain region 5 by distance D4. Accordingly, the channel stop region 59 is not in contact with the drain region 5, and thus destruction of a p-n junction hardly occurs.

Even if gate length L2 is made shorter in order to reduce the size of the transistor 51, the isolation region 7 and the gate electrode 9 can easily be aligned positionally so that the end line of the projecting area 58 is below the gate electrode 9. Accordingly, the production yield is high.

MODIFICATION 3

Figure 17:
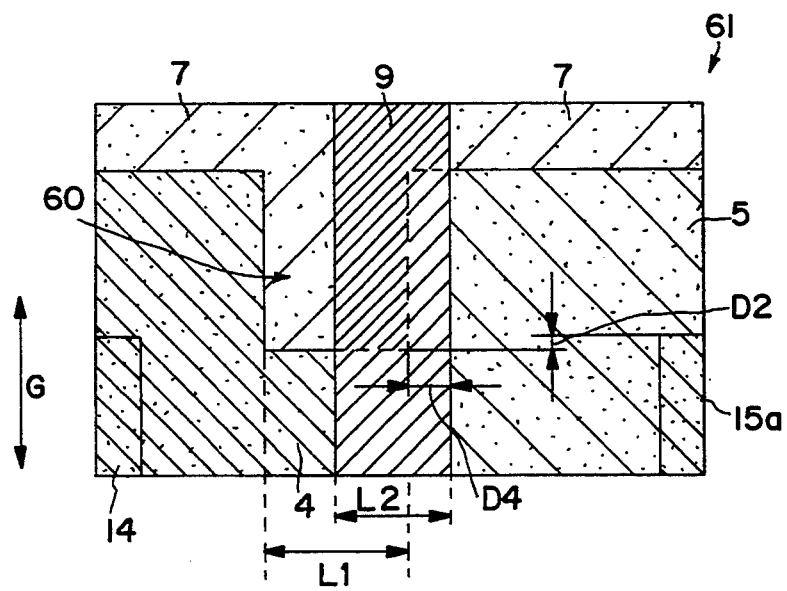
FIG. 17 is an enlarged plan view of a part of a transistor in still another modification of the transistor shown in FIG. 7 in the second example according to the present invention.

As is shown in FIG. 17, a MOS transistor 61 is provided with two projecting areas 60 of the isolation region 7 instead of the projecting areas 52. FIG. 17 is a plan view of a part of the transistor 61 including one of the projecting areas 60.

The projecting area 60 is extended in direction G on a portion of the area 54 in the source region 4, and has such a length as to overlap the contact region 15a by distance D2. Distance D2 is, for example, approximately 0.1 μm. The projecting area 60 is also extended by width L1 in a direction perpendicular to direction G below the gate electrode 9. The projecting area 60 and the drain region 5 are away from each other by distance D4.

A channel stop region (not shown in FIG. 17) is provided below each projecting area 60. The channel stop region 62, which is formed using a mask for forming the isolation region 7 having the projecting areas 60, is away from the drain region 5 by distance D4. Accordingly, the channel stop region 62 is not in contact with the drain region 5, and thus destruction of a p-n junction hardly occurs.

Even if gate length L2 is made shorter in order to reduce the size of the transistor 61, the isolation region 7 and the gate electrode 9 can easily be aligned positionally so that the end line of the projecting area 60 is below the gate electrode 9. Accordingly, the production yield is high.

EXAMPLE 3

Figure 18:
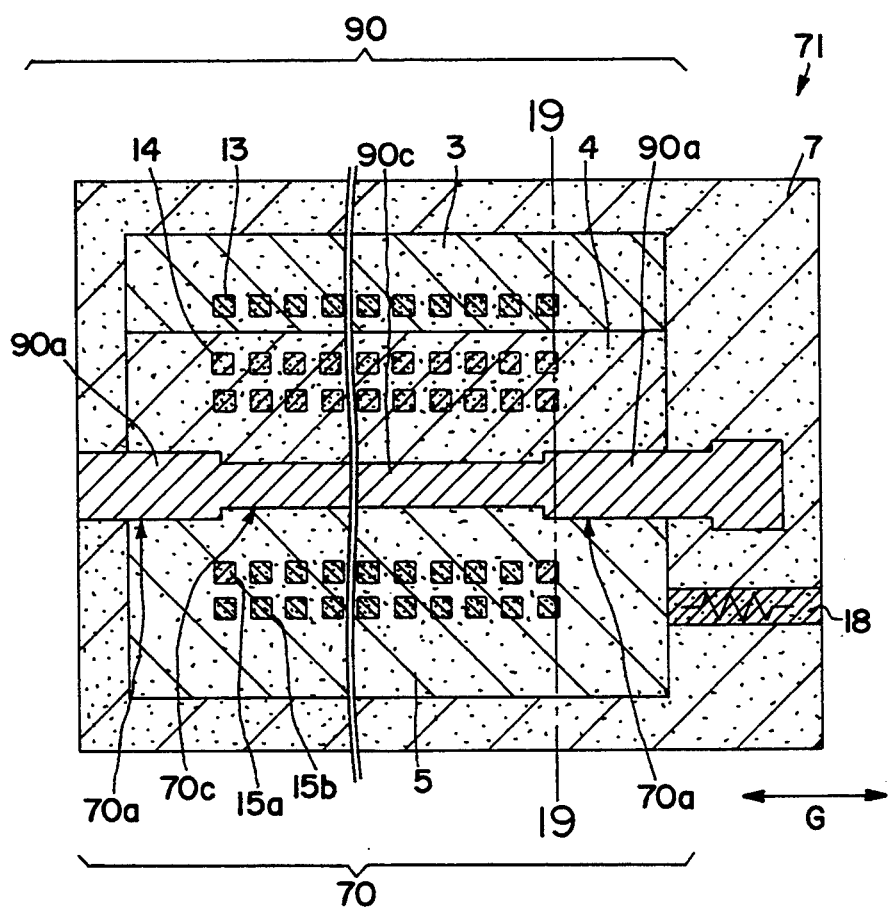
FIG. 18 is a plan view in section of a transistor for protection against electrostatic discharge in a third example according to the present invention.
Figure 19:
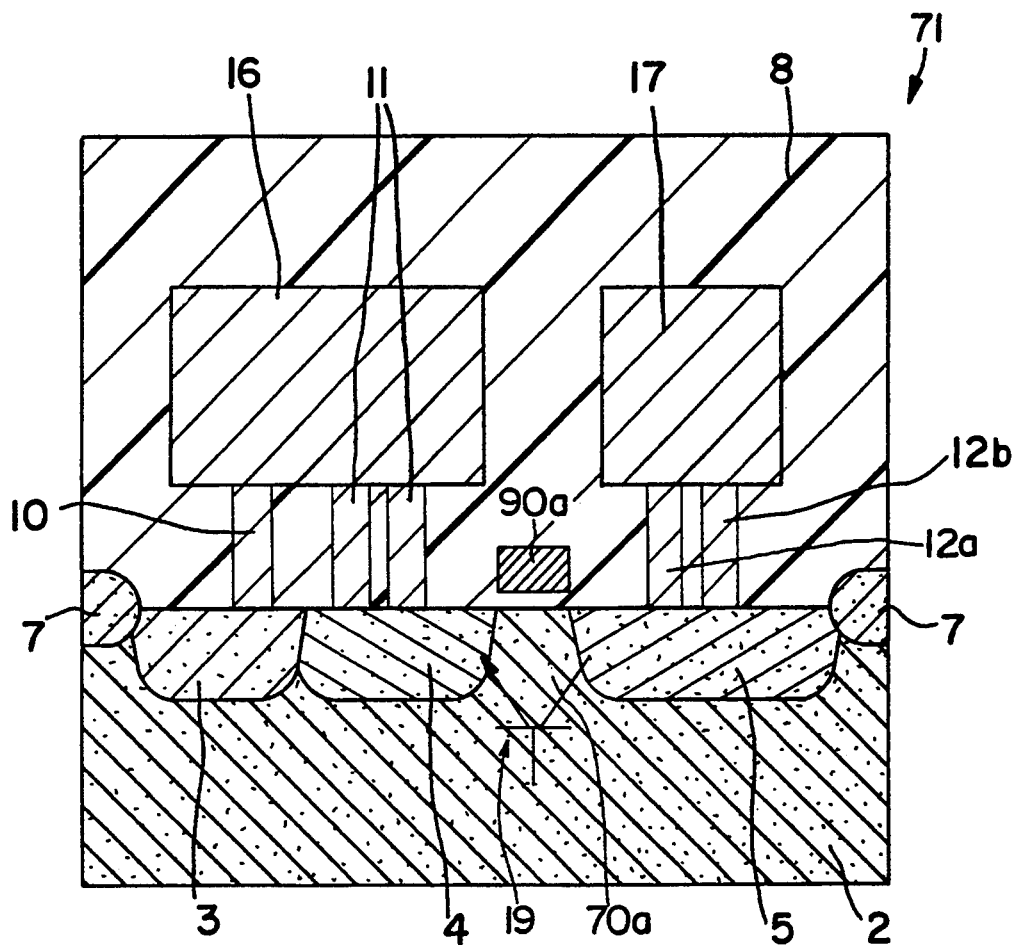
FIG. 19 is a cross sectional view of the transistor shown in FIG. 18 to show section line 19—19 in FIG. 18.

FIG. 18 is a plan view in section of a MOS transistor 71 for protection against electrostatic discharge in a third example according to the present invention; and FIG. 19 is a cross sectional view of the transistor 71 shown in FIG. 18 to show section line 19—19 in FIG. 18. Identical elements with those in the first example bear identical reference numerals therewith.

As is shown in FIGS. 18 and 19, the transistor 71 includes a semiconductor substrate 2 formed of p-type silicon having a sheet resistance of approximately 500 ohms per square. The semiconductor substrate 2 includes a p+-type diffusion region 3, a source region 4, and a drain region 5. The source region 4 and the drain region 5 each have a depth of approximately 0.15 μm and a sheet resistance of approximately 100 ohms per square. The p+-type diffusion region 3 is provided in order to apply a bias voltage to the semiconductor substrate 2. An island including the p+-type diffusion region 3, the source region 4, and the drain region 5 is surrounded by an isolation region 7 also included in the semiconductor substrate 2.

Figure 20:
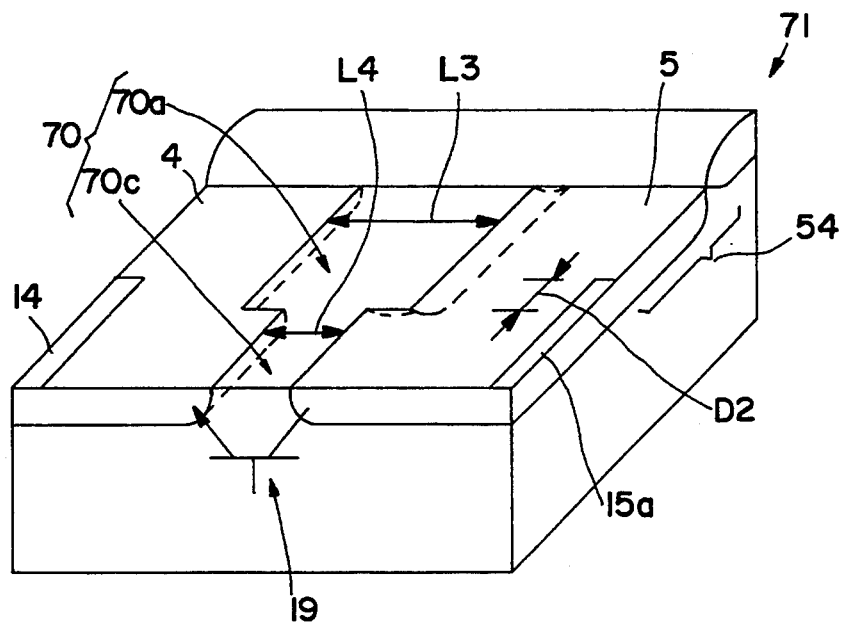
FIG. 20 is an enlarged isometric view of a part of the transistor shown in FIG. 18.

As is illustrated in FIG. 20 in detail, a channel region 70 is provided between the source region 4 and the drain region 5 for distributing the current generated by an electrostatic voltage applied to the drain region 5 to various parts of the drain region 5. The channel region 70 has two end areas 70a each having a longer channel length than the channel length of a central area 70c. In FIG. 20, only one of the two end areas 70a is shown for simplicity.

The semiconductor substrate 2 is provided with an insulating layer 8 formed of silicon oxide on a surface thereof. A gate electrode 90 are provided above the channel region 70 with a part of the insulating film 8 interposed therebetween. The part of the insulating film 8 which is located between the gate electrode 90 and the channel region 70 has a thickness of approximately 10 nm, and acts as a gate insulating layer. The gate electrode 90 is extended along direction G. The gate lengths of two end areas 90a of the gate electrode 90 are each longer than the gate length of a central area 90c thereof. The insulating layer 8 includes contact holes 10, 11, 12a and 12b. The contact holes 10 respectively define a plurality of contact regions 13 on the p+-type diffusion region 3; and contact holes 11 respectively define a plurality of contact regions 14 on the source region 4. The contact holes 12a respectively define two contact regions 15a on the drain region 5. The contact holes 12b respectively define a plurality of contact regions 15b on the drain region 5.

In the insulating layer 8, wires 16 and 17 made of aluminum are formed. The wire 16 is electrically connected to the p+-type diffusion region 3 and the source region 4 through the contact holes 10 and 11, respectively. The wire 17 is electrically connected to the drain region 5 through the contact holes 12a and 12b. The drain 5 is connected to an input gate inverter (not shown) through a resistance 18 provided in the semiconductor substrate 2 for protection against electrostatic discharge. The wire 16 and the gate electrode 90 are both grounded. The wire 17 is connected to an input pad (not shown)

Referring to FIG. 20, how the electrostatic voltage applied to the drain region 5 is distributed to various parts of the drain region 5 will be described in detail.

As is shown in FIG. 20, the channel region 70 is interposed between the source region 4 and the drain region 5. As is briefly mentioned above, the channel region 70 includes the two ends areas 70a and the central area 70c. Channel length L3 of each area 70a is longer than channel length L4 of the central area 70c. Practically, L3 is 0.8 μm, and L4 is 1.6 μm. The end area 70a has such a width as to overlap the contact region 15a by distance D2.

The transistor 71 having the above-described structure operates in the following manner:

An electrostatic voltage is applied to the input pad and is sent to the contact regions 15a and 15b on the drain region 5 through the wire 17 and the contact holes 12a and 12b. Such an electrostatic voltage raises the potential of the drain region 5 and further raises the potential of the semiconductor substrate 2. As a result, a current is generated and flows so as to operate the source region 4, the drain region 5, and the channel region 70 as a parasitic bipolar transistor 19. The source region 4 acts as an emitter, the drain region 5 acts as a collector, and the channel region 70 acts as a base of the bipolar transistor 19. The electrostatic voltage applied to the drain region 5 flows out to the ground through the source region 4. Since channel length L3 of the end area 70a of the channel region 70 is longer than channel length L4 of the central area 70c, the current flows less easily through the end area 70a than in the central area 70c. Accordingly, the amount of the current flowing through the end area 70a is small. Thus, the current hardly flows to the area 54 of the drain region 5 through the end area 70a. As a result, concentration of the current on the contact regions 15a is alleviated. Accordingly, the contact regions 15a are prevented from being destroyed by melting of the semiconductor substrate 2. As is mentioned above, due to the channel region 70, the current generated by the electrostatic voltage can be prevented from flowing to the area 54 of the drain region 5 close to the isolation region 7.

The transistor 71 according to the present invention can be produced by conventional production technologies, namely, only by altering the pattern of a mask so as to define the gate electrode 90 in the production process of the semiconductor apparatus in which the transistor 71 is included. Practically, a mask having the pattern of the gate electrode 90 in which the gate length of the two end areas 90a are each longer than the gate length of the central area 90c is formed (FIG. 18), and the gate electrode 90 is formed using the mask. Then, n-type impurities are implanted into the semiconductor substrate 2 using the gate electrode as a mask to form the source region 4 and the drain region 5. In this manner, the channel region 70 including the two end areas 70a and the central area 70c having a shorter channel length than that of the end areas 70a is formed below the gate electrode 90.

Figure 21:
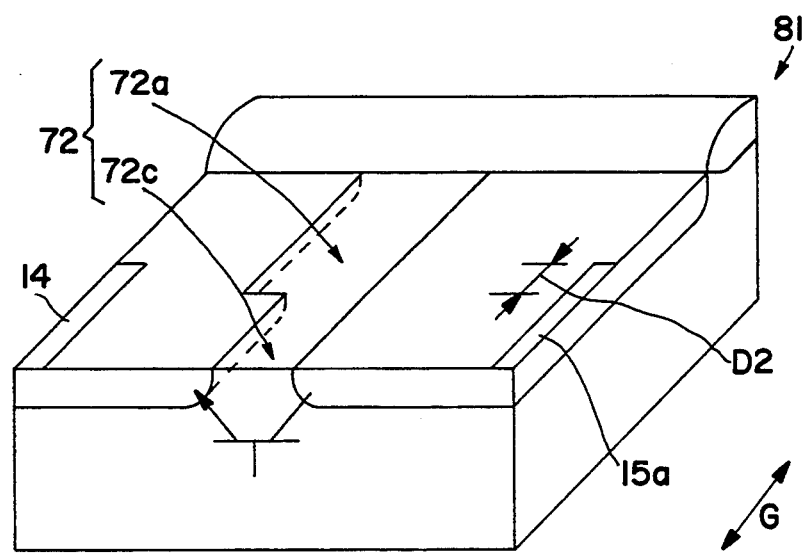
FIG. 21 is an enlarged isometric view of a part of a transistor in a modification of the transistor shown in FIG. 18 in the third example according to the present invention.
Figure 22:
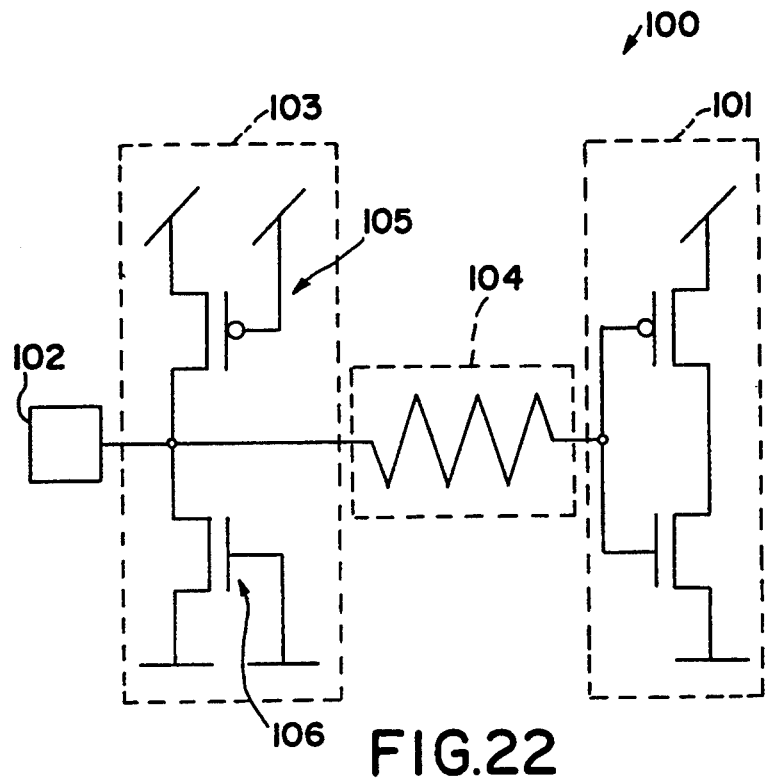
FIG. 22 is a circuit diagram of a conventional circuit for protection against electrostatic discharge.
Figure 23:
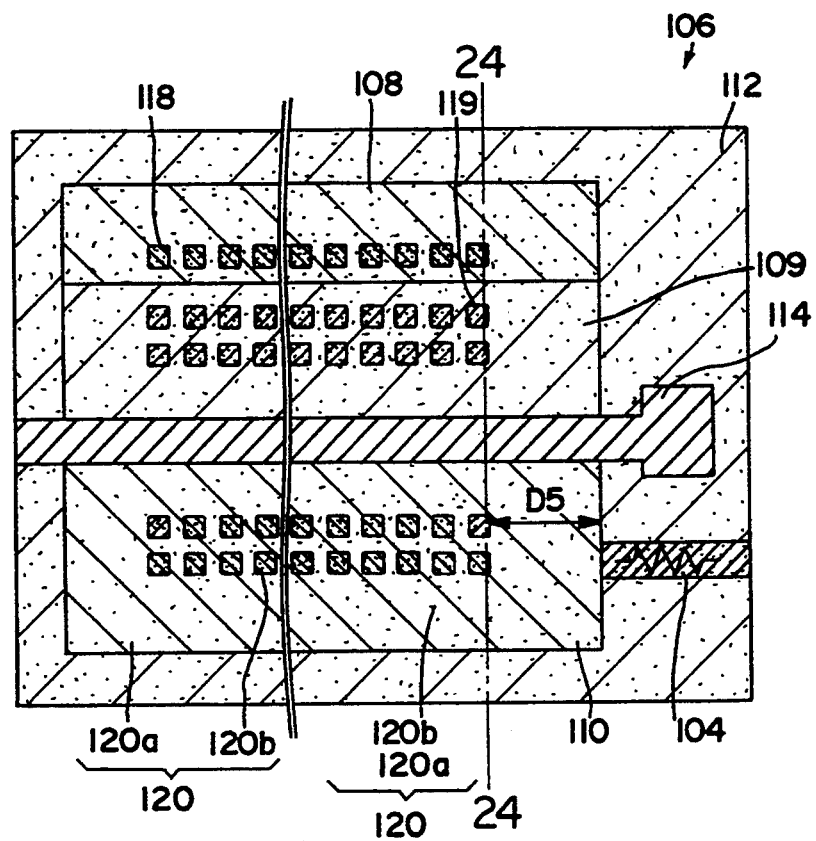
FIG. 23 is a plan view in section of a conventional MOS transistor used in the circuit shown in FIG. 22.
Figure 24:
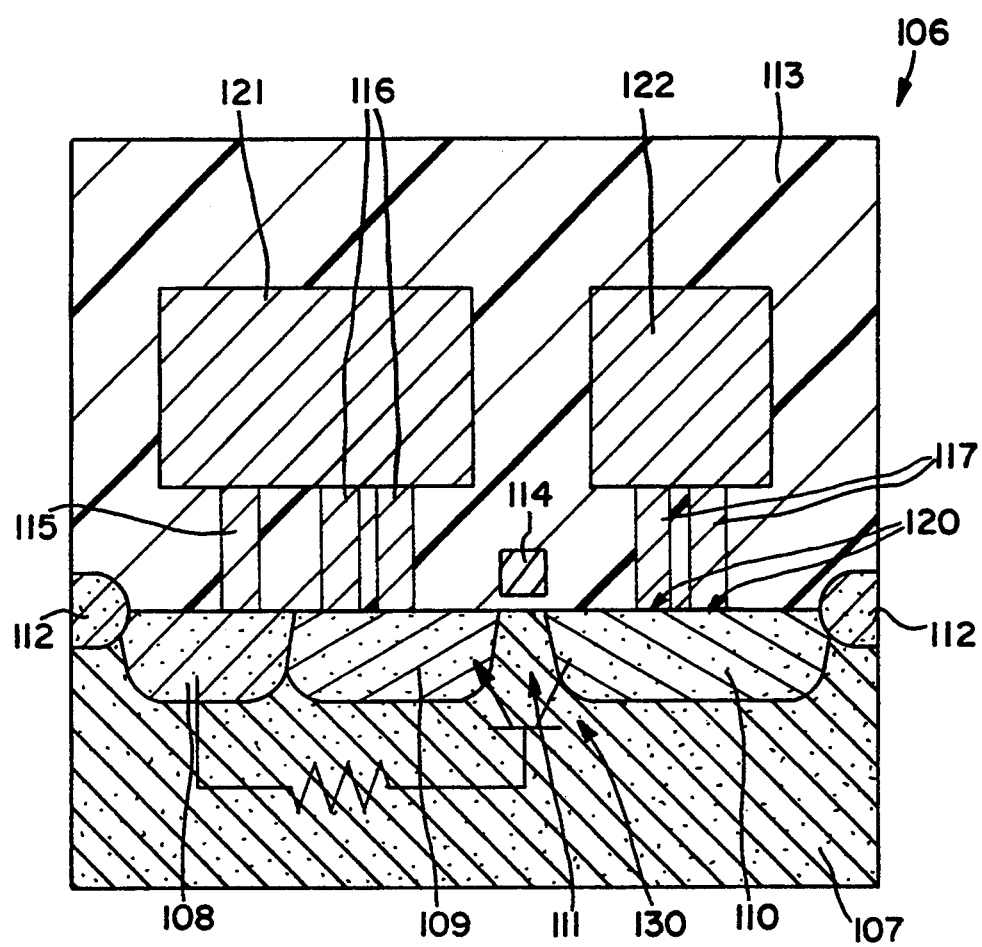
FIG. 24 is a cross sectional view of the transistor shown in FIG. 23 to show section line 24—24 in FIG. 23.
Figure 25:
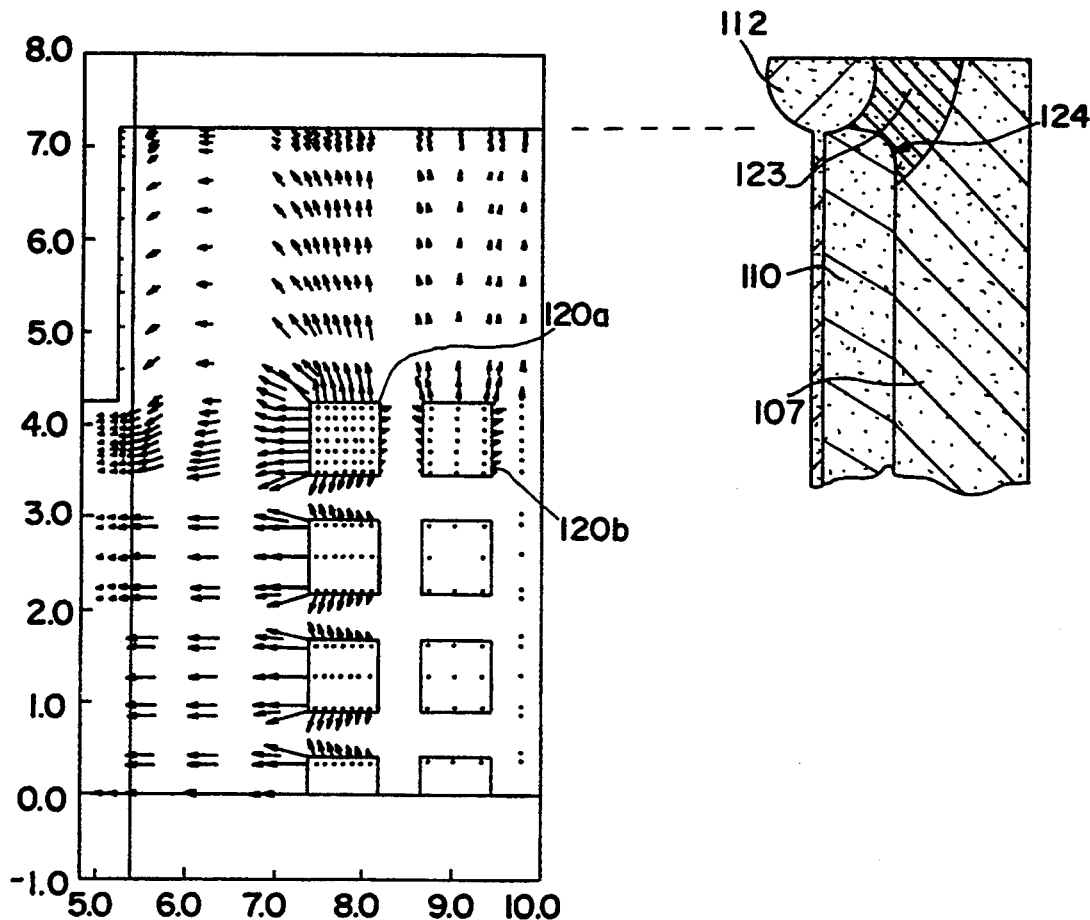
FIG. 25 is a view illustrating flow directions of the current in the transistor shown in FIG. 23.
Figure 25:
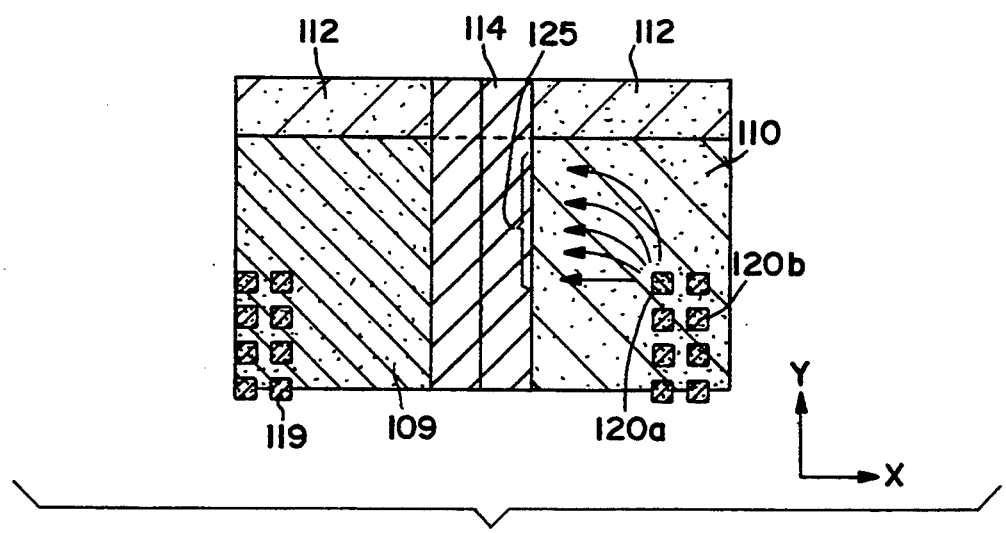
Figure 26:
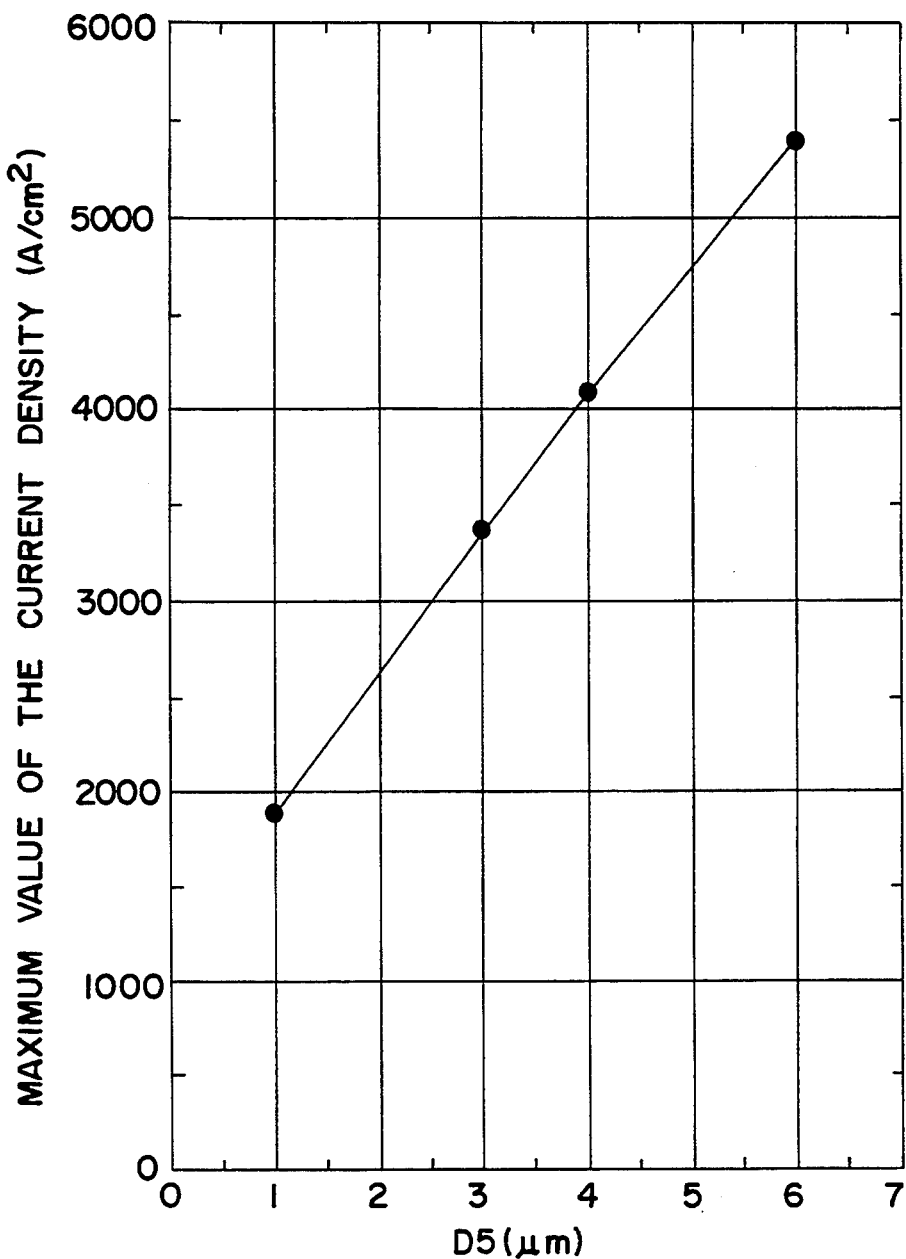
FIG. 26 is a graph illustrating the relationship between the distance between an isolation region and a contact region and the maximum value of the current density in the contact region.

FIG. 21 shows a modification of the transistor 71 in the third example. A MOS transistor 81 shown in FIG. 21 is provided with a channel region 72, instead of the channel region 70, for distributing the current generated by an electrostatic voltage applied to the drain region 5 to various parts of the drain region 5. The channel region 72 includes two end areas 72a (only one is shown in FIG. 21) and a central area 72c having a shorter channel length than that of each end area 72a. The end area 72a is extended into the source region 4 in a direction perpendicular to direction G to have a longer channel length than the central area 72c. The channel region 72 having such a structure does not reduce the resistance of an area of the drain region 5 between the contact region 15a and the channel region 72, and thus concentration of the current on the contact region 15a is further alleviated.

In Examples 1, 2 and 3, a transistor for protection against electrostatic discharge has been described as being connected to an input pad. Needless to say, the present invention may be applied to a transistor connected to an output pad or an I/O pad.

In Examples 1, 2 and 3, a MOSFET having an n-type channel for protection against electrostatic discharge according to the present invention has been described. Needless to say, the present invention may be applied to MOSFETs including a p-type channel for protection against electrostatic discharge having various isolation elements or various gate electrode shapes. The present invention is also applicable to a complimentary MOSFET including an n-type channel or a p-type channel.

Moreover, a MOS transistor for protection against electrostatic discharge explained in Example 1 may further include a distributing device for distributing the current generated by the electrostatic voltage applied to the drain region into the drain region explained in Example 2 or in Example 3. For example, a MOS transistor 1 shown in FIGS. 1 and 2 may further include the two projecting areas 52 shown in FIGS. 7, 8 and 9. Alternatively, a MOS transistor 1 shown in FIGS. 1 and 2 may further include the channel region 70 shown in FIGS. 18, 19 and 20 instead of the channel region 6. It is understood that such a MOS transistor of the invention including two different distributing devices can also have a high breakdown voltage.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A MOS transistor for protection against electrostatic discharge, comprising:
   a semiconductor substrate;
   an island including a source region and a drain region provided in the semiconductor substrate;
   an isolation region provided in the semiconductor substrate so as to surround the island;
   a gate insulating layer provided on the semiconductor substrate;
   a gate electrode provided on the gate insulating layer; and
   distributing means, provided at a surface of the drain region, for distributing an electric current generated by an electrostatic voltage applied to the drain region onto the drain region, the distributing means including a contact region on the drain region, the contact region having a notch at a corner of the contact region proximate to the gate electrode and to the isolation region.

2. A MOS transistor for protection against electrostatic discharge, comprising:
   a semiconductor substrate;
   an island including a source region and a drain region provided in the semiconductor substrate;
   an isolation region provided in the semiconductor substrate so as to surround the island;
   a gate insulating layer provided on the semiconductor substrate;
   a gate electrode provided on the gate insulating layer; and
   distributing means, provided at a surface of the drain region, for distributing an electric current generated by an electrostatic voltage applied to the drain region onto the drain region, the distributing means including a plurality of contact regions on the drain region, at least one of the plurality of contact regions proximate to the gate electrode and to the isolation region having a larger area than an area of each of the other contact regions.

3. A MOS transistor for protection against electrostatic discharge according to claim 1, wherein the contact region is divided into a plurality of sub-contact regions.

4. A MOS transistor for protection against electrostatic discharge, comprising:
   a semiconductor substrate;
   an island including a source region and a drain region provided in the semiconductor substrate;
   an isolation region provided in the semiconductor substrate so as to surround the island;
   a gate insulating layer provided on the semiconductor substrate;
   a gate electrode provided on the gate insulating layer; and
   preventing means, provided between the source region and the drain region, for preventing an electric current generated by an electrostatic voltage applied to the drain region from flowing to an area of the drain region proximate to the isolation region, the preventing means including a projection area projecting from the isolation region to a center of the island in at least an area below the gate electrode.

5. A MOS transistor for protection against electrostatic discharge according to claim 4, further comprising a contact region on the drain region, the contact region being provided away from the isolation region by a distance which is shorter than the length of the projecting area.

6. A MOS transistor for protection against electrostatic discharge according to claim 4, wherein the preventing means further includes a channel stop region below the projecting area.

7. A MOS transistor for protection against electrostatic discharge according to claim 6, wherein the gate length of the gate electrode is longer than the width of the projecting area.

8. A MOS transistor for protection against electrostatic discharge, comprising:
- a semiconductor substrate;
- an island including a source region and a drain region provided in the semiconductor substrate;
- an isolation region provided in the semiconductor substrate so as to surround the island;
- a gate insulating layer provided on the semiconductor substrate;
- a gate electrode provided on the gate insulating layer; and
- preventing means, provided between the source region and the drain region, for preventing an electric current generated by an electrostatic voltage applied to the drain region from flowing to an area of the drain region proximate to the isolation region, the preventing means including a channel region between the source region and the drain region, the channel region including a central area and two end areas each having a longer channel length than the channel length of the central area.

9. A MOS transistor for protection against electrostatic discharge according to claim 8, further comprising a contact region on the drain region, the contact region being provided away from the isolation region by a distance which is longer than the width of each of the two end areas of the channel region.

* * * * *